United States Patent [19]  
Williams

[11] 4,436,766  
[45] Mar. 13, 1984

[54] PLATED BRIDGE STEP-OVER CONNECTION FOR MONOLITHIC DEVICES AND METHOD FOR MAKING THEREOF

[75] Inventor: Ralph E. Williams, Richardson, Tex.

[73] Assignee: The United States of America as represented by the Secretary of the Navy, Washington, D.C.

[21] Appl. No.: 263,821

[22] Filed: May 15, 1981

[51] Int. Cl.³ .................................................. H01L 21/88
[52] U.S. Cl. ............................................. 427/96; 204/15; 204/192 R; 427/79; 427/80; 430/314; 430/315
[58] Field of Search .................. 430/315, 314; 427/79, 427/80; 204/15, 192 R; 427/96

[56] References Cited

U.S. PATENT DOCUMENTS

| 4,054,484 | 10/1977 | Lesh | 427/89 |
| 4,200,975 | 5/1980 | Debiec | 427/96 |
| 4,289,846 | 9/1981 | Parks | 427/96 |
| 4,293,637 | 10/1981 | Hatada | 430/315 |

Primary Examiner—John D. Smith  
Attorney, Agent, or Firm—Richard S. Sciascia; Harvey A. David

[57] ABSTRACT

A step-over connection in a monolithic device including laterally spaced metalizations having upper surfaces at one or more levels above a supporting substrate and a dielectric layer over one of the metalizations. The connection is in the form of a metal bridge spanning the space between the metalizations, and is formed by successive steps of providing a first resist layer, forming openings therein, etching away an area of dielectric layer, gold plating pillars on the exposed metalization surfaces, sputtering a gold film on the first resist layer and exposed pillars, providing a second resist layer with a pillar connecting bridge pattern opening, gold plating the bridge connection on the exposed sputtered gold film, and removing the resist layers and excess gold film.

3 Claims, 5 Drawing Figures

PLATED BRIDGE STEP-OVER CONNECTION FOR MONOLITHIC DEVICES AND METHOD FOR MAKING THEREOF

BACKGROUND OF THE INVENTION

This invention relates generally to the field of thin film microcircuit technology, and more particularly to the formation of connections between metalizations at the same or different elevations and requiring a step-over of one or more insulator edges, for example of a dielectric layer separating a capacitor plate metalization from a substrate supported metalization in a monolithic capacitor device.

Because the evaporation and sputtering metalization techniques such as are usually used in making step-over connections deposit metal somewhat directionally, like a snowfall, the build-up is greatest on more or less horizontal surfaces, and least on vetical or steeply sloping surfaces. Accordingly, the quality of a conventional step-over connection is dependent upon the size and character of the insulator edge. Many insulators, such as silicon nitride used on Ga As monolithic devices, are not amenable to producing smoothly sloped edges. Hence the step-over problem is difficult if not impossible for these insulators. Even where epitaxial growth of silicon nitride produces smaller steps and more rounded edges, production yield rates are lower than are desirable.

SUMMARY OF THE INVENTION

With the foregoing in mind, it is a principal object of this invention to provide an improved step-over connection for use between metalizations in a monolithic device, and a method of manufacture thereof.

Another object is to improve the yield rate of manufacture of monolithic electronic devices having step-over connection requirements.

Still another object is to provide a method and the resulting structure of a step-over connection that is more durable and reliable in operation, and which can avoid or lessen series capacitance effects in some constructions.

As another object the invention aims to accomplish the foregoing objects and advantages, as well as others which will become apparent from the following detailed description, through certain procedural steps, combinations of elements, or arrangements of parts, as will be understood when read in conjunction with the accompanying sheet of drawings forming a part hereof.

Figure 1:
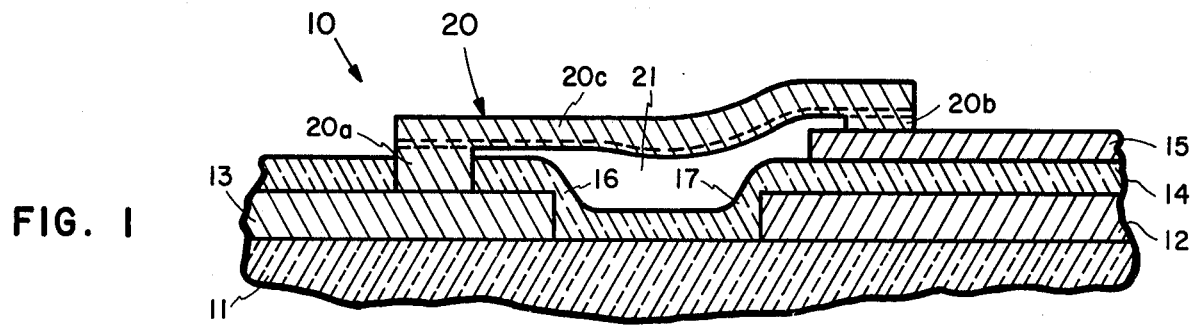
FIG. 1 is a vertical sectional view through a monolithic capacitor device including a step-over connection embodying the invention and formed in accordance with the method of the invention.

In the exemplary form of the invention illustrated in the drawings, and with reference first to FIG. 1, a monolithic capacitor device is indicated generally at 10 and comprises a base in the form of a substantially non-conductive substrate 11 formed of a suitable crystalline slice or a ceramic material. It will be understood, of course, that for purposes of illustration some relative thicknesses are exaggerated in the drawings which are not to any particular scale. A first capacitor plate 12 is provided as a metalization on the upper surface of the substrate 11. An adjacent conductor element 13 is provided as another metalization on the upper surface of the substrate 11. A dielectric layer 14, formed in this example of silicon nitride, separates the first capacitor plate 12 from a second capacitor plate 15 provided as a metalization on top of the dielectric layer. The dielectric layer 14 extends over the spaced edges of the plate 12, the conductor 13, and the substrate surface therebetween. It will be noted that although curved by epitaxial growth of the silicon nitride dielectric layer 14 from all surfaces, the steps 16 and 17 are sufficiently steep and high to cause a problem of nonuniformity of thickness were a metalizing layer to be deposited by evaporation directly over those steps.

According to the invention, a conducting bridge 20, having pillar portions 20a, 20b, extending upwardly from the conductor 13 and the capacitor plate 12, and an air space 21 defining span portion 20c connecting the pillar portions and hence the conductor 13 and the upper capacitor plate 15 electrically. This structure results from the method about to be described.

Figure 2:
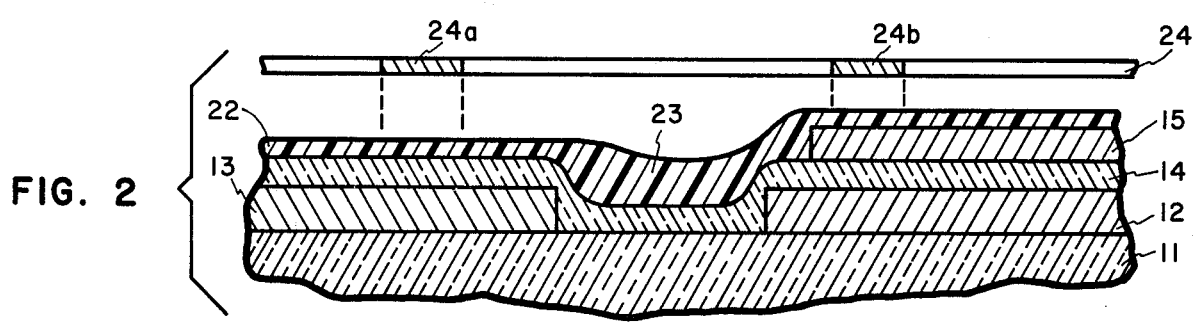
FIGS. 2 through 5 illustrate successive steps in the method of forming the connection of FIG. 1.

Referring now to FIG. 2, the substrate 11, metalizations 12 and 13, the dielectric layer 14, and the metalization 15 have previously been formed by conventional techniques, noting that the dielectric layer covers the entire upper surface of concern of the metalization 13. A layer 22 of resist material, conveniently of the type wherein areas activated by light are rendered insoluble compared to non-activated areas, is spun onto the exposed surfaces and allowed to cure. The resist can be allowed to collect to a thicker layer in the valley area 23 between the adjacent metalizations.

Figure 3:
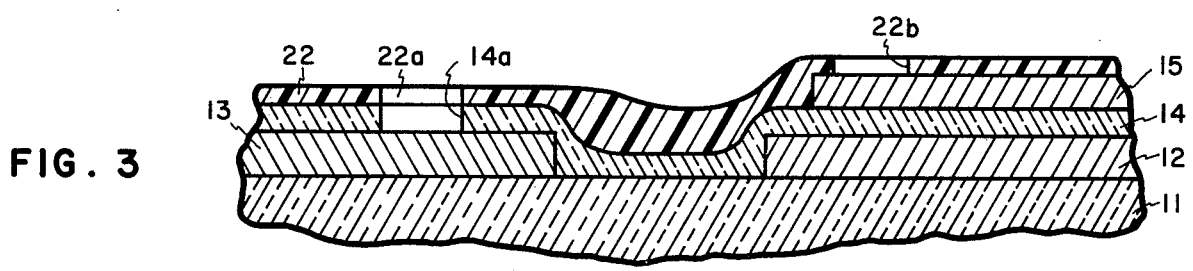
Figure 4:
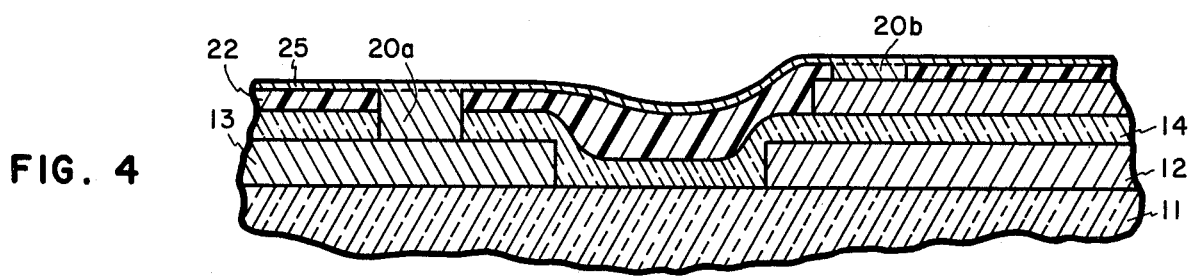
Figure 5:
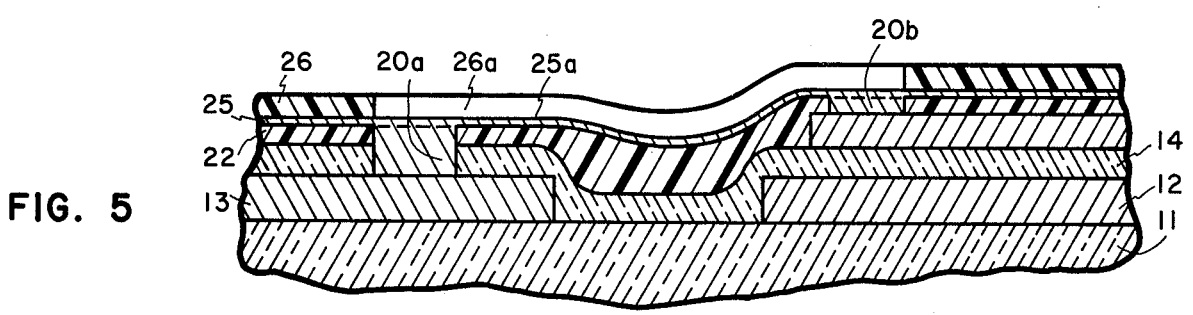

Next, a mask 24 is superposed over the resist layer 22, the mask having opaque areas 24a, 24b corresponding to the areas of pillars 20a, 20b. After exposure to light through the mask, the areas of the resist layer 22 corresponding to the mask opaque areas are dissolved away to form windows or penetrations 22a, 22b in the resist as shown in FIG. 3. The penetrations 22a, 22b expose corresponding areas of the upper surfaces of the nitride dielectric layer 14 and the upper capacitor plate or metalization 15. The silicon nitride exposed through penetration 22a is then etched away as at 14a to expose a corresponding area of the upper surface of the conductor metalization 13.

Thereafter, the metal surfaces exposed through the penetrations 22a, 22b are gold plated up to about the upper surface of the resist layer to form the pillars 20a, 20b, respectively. At this stage, and with the resist layer 22 still in place, a thin layer or film 25 of gold is sputtered onto the entire upper surface including the resist and the pillars 20a, 20b. More resist is then spun onto the slice to form a resist layer 26. Using an appropriate mask (not shown) a "bridge pattern" opening or penetration 26a is formed through the resist layer 26, exposing a corresponding area 25a of the sputtered gold film 25 between and on the pillars 20a, 20b.

Next, gold is plated onto the exposed sputtered gold film area 25a, until the exposed area is increased in thickness up to about the level of the resist layer 26, to form the bridge span portion 20c and complete the conducting metal bridge connection.

Thereafter, "lifting" of the resist layers 26 and 22 removes all of the thin layer 25 of sputtered gold that was not plated. Further, removal of the original lower layer 22 of resist results in the air space 21 between the bridge and the slice, or the nitride layer 14 thereon. In FIG. 1 the dotted lines merely indicate that the metal bridge connection was built up by the described method, the resulting plated up pillars, sputtered film, and plated connecting portion all resulting in an integral connection between and with the metalizations 13 and 15.

The method and construction described can, of course, be used to form step-over connections between metalizations at equal levels as well as at different elevations, and for connecting purposes to or between components other than capacitors. Moreover, for monolithic devices incorporating inductors, this invention would allow the inductors to be fabricated on top of the insulator (silicon nitride in this case) with any connections to lower level metalization being made using the plated connection technique described herein.

Obviously, other embodiments and modifications of the subject invention will readily come to the mind of one skilled in the art having the benefit of the teachings presented in the foregoing description and the drawing. It is, therefore, to be understood that this invention is not to be limited thereto and that said modifications and embodiments are intended to be included within the scope of the appended claims.

What is claimed is:

1. A method of forming a step-over connection in a monolithic device having a substrate, a plurality of laterally spaced metalizations supported by said substrate, and a dielectric layer over at least one of said metalizations, comprising the steps of:

providing a first resist layer having a finite thickness over said metalizations and said dielectric layer;

forming first and second openings in said first resist layer layer exposing at least one selected surface area of said dielectric layer and a selected first area of said metalizations;

etching said dielectric layer in said selected surface area thereof to expose a selected second area of said metalizations;

plating metal onto said first and second areas of said metalizations to form first and second pillars having a height about equal to said thickness of said first resist layer;

forming a thin sputtered metal layer over said first resist layer and said pillars;

providing a second resist layer over said sputtered metal layer;

forming a connector bridge pattern opening in said second resist layer, said connector bridge pattern opening exposing said first and second pillars and a connecting area of said sputtered metal layer therebetween;

plating metal onto said pillars and exposed sputtered metal layer to form a metal bridge connector spanning the space between said metalizations; and removing said first and second resist layers and said sputtered metal layer external to said bridge pattern opening.

2. The method defined in claim 1, and wherein:
said plating metal and said sputtered metal layer forming steps are performed with gold.

3. The method defined in claim 2, and wherein:
said dielectric layer comprises silicon nitride.

* * * * *